United States Patent
Watanabe et al.

(10) Patent No.: US 11,341,664 B2
(45) Date of Patent: May 24, 2022

(54) APPARATUS AND METHOD FOR VISUALIZATION

(71) Applicant: FUJITSU LIMITED, Kawasaki (JP)

(72) Inventors: Masahiro Watanabe, Kawasaki (JP); Daisuke Kushibe, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 119 days.

(21) Appl. No.: 16/442,681

(22) Filed: Jun. 17, 2019

(65) Prior Publication Data

US 2020/0005475 A1    Jan. 2, 2020

(30) Foreign Application Priority Data

Jun. 29, 2018 (JP) .............................. JP2018-124684

(51) Int. Cl.
  *G06T 7/50* (2017.01)
  *G06T 17/10* (2006.01)
  *G06F 30/23* (2020.01)

(52) U.S. Cl.
  CPC ............... *G06T 7/50* (2017.01); *G06F 30/23* (2020.01); *G06T 17/10* (2013.01); *G06T 2207/30196* (2013.01)

(58) Field of Classification Search
  None
  See application file for complete search history.

(56) References Cited

U.S. PATENT DOCUMENTS

| | | | |
|---|---|---|---|
| 2010/0178644 A1* | 7/2010 | Meglan | G16H 50/50 434/267 |
| 2017/0108930 A1* | 4/2017 | Banerjee | A61B 90/37 |
| 2017/0294050 A1* | 10/2017 | Popescu | B29C 64/386 |
| 2017/0316619 A1 | 11/2017 | Kitamura | |
| 2018/0140362 A1* | 5/2018 | Cal | A61B 34/20 |

FOREIGN PATENT DOCUMENTS

| | | |
|---|---|---|
| JP | 2016-168078 A | 9/2016 |
| JP | 2016-181205 A | 10/2016 |

OTHER PUBLICATIONS

Müller, Matthias, Simon Schirm, and Matthias Teschner. "Interactive blood simulation for virtual surgery based on smoothed particle hydrodynamics." Technology and Health Care 12.1 (2004): 25-31. (Year: 2004).*

Japanese Office Action dated Dec. 28, 2021, for corresponding Japanese Application No. 2018-124684 Full machine translation.

* cited by examiner

*Primary Examiner* — David Perlman
(74) *Attorney, Agent, or Firm* — Xsensus LLP

(57) ABSTRACT

A visualization apparatus detects a change in the shape of a solid model of a human body part based on images obtained by capturing the solid model. Next, the visualization apparatus generates a three-dimensional model reproducing the shape of the human body part in virtual space based on three-dimensional model data representing the shape of the human body part in three dimensions. The visualization apparatus further transforms the shape of the three-dimensional model into a transformed three-dimensional model in accordance with the change in the shape of the solid model. Then, the visualization apparatus outputs images of the transformed three-dimensional model.

5 Claims, 15 Drawing Sheets

112 SIMULATION RESULT DATA

AORTA DATA SET 112a 112b 112c

TIME STEP #1

| ELEMENT/<br>NODE ID | LOCATION | PHYSICAL<br>QUANTITY A | PHYSICAL<br>QUANTITY B | ... |
|---|---|---|---|---|
| ELEMENT 1 | (x1,y1,z1) | data11 | data21 | ... |
| ELEMENT 2 | (x2,y2,z2) | data12 | data22 | ... |
| ELEMENT 3 | (x3,y3,z3) | data13 | data23 | ... |
| ... | ... | ... | ... | ... |
| NODE 1 | (x4,y4,z4) | data14 | data24 | ... |
| NODE 2 | (x5,y5,z5) | data15 | data25 | ... |
| NODE 3 | (x6,y6,z6) | data16 | data26 | ... |
| ... | ... | ... | ... | ... |

FIG. 6 ions particularly pointed out in the claims.
APPARATUS AND METHOD FOR VISUALIZATION

CROSS-REFERENCE TO RELATED APPLICATION

This application is based upon and claims the benefit of priority of the prior Japanese Patent Application No. 2018-124684, filed on Jun. 29, 2018, the entire contents of which are incorporated herein by reference.

FIELD

The embodiments discussed herein are related to an apparatus and method for visualization.

BACKGROUND

The motion of a human body part may be simulated on a computer. For example, the behavior of heart muscle of a patient and ischemic conditions of the heart muscle may be reproduced on a computer by building a three-dimensional (3D) model of the heart of the patient in virtual space and running a cardiac simulation using the built 3D model. Then, the simulation results are visualized with the use of, for example, visualization technology, such as augmented reality (AR) and virtual reality (VR).

On the other hand, in order to comprehend the shape of the patient's body part, a tangible solid 3D model of the body part may be employed. The solid model of the body part may be created using a 3D printer. For example, based on 3D model data of the heart of the patient, the 3D printer is able to create a solid model having the same shape as the patient's heart. This allows, for example, a doctor to accurately comprehend the actual size of the heart and location of an affected area before performing surgery.

One example of medical support technology using a 3D solid internal organ model is a medical observation support system that provides highly practical observation support enabling intuitive manipulation. This support system reflects the manipulation of a pointer indicating a location on the 3D solid organ model in an image of the organ.

See, for example, Japanese Laid-open Patent Publication No. 2016-168078.

Solid models with a reproduced shape of a patient's body part offer tangible advantages to doctors. For example, a doctor changes the form of such a solid model by pressing a part of the solid model or making an incision therein, to thereby gain a preoperative understanding of how the body part would transform. However, conventionally, it is not possible to transform a corresponding 3D model on a computer in accordance with the transformation made to the solid model. Thus, the shape of the transformed body part is unable to be accurately reproduced on the 3D computer model.

SUMMARY

According to an aspect, there is provided a visualization apparatus including: a memory configured to store three-dimensional model data representing a shape of a human body part in three dimensions; and a processor configured to execute a process including detecting a change in a shape of a solid model of the human body part based on an image obtained by capturing the solid model, generating a three-dimensional model reproducing the shape of the human body part in virtual space based on the three-dimensional model data, transforming a shape of the three-dimensional model into a transformed three-dimensional model in accordance with the change in the shape of the solid model, and outputting an image of the transformed three-dimensional model.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 illustrates an example of simulation result data;

DESCRIPTION OF EMBODIMENTS

Several embodiments will be described below with reference to the accompanying drawings. These embodiments may be combined with each other, unless they have contradictory features.

(a) First Embodiment

A first embodiment is described next.

Figure 1:
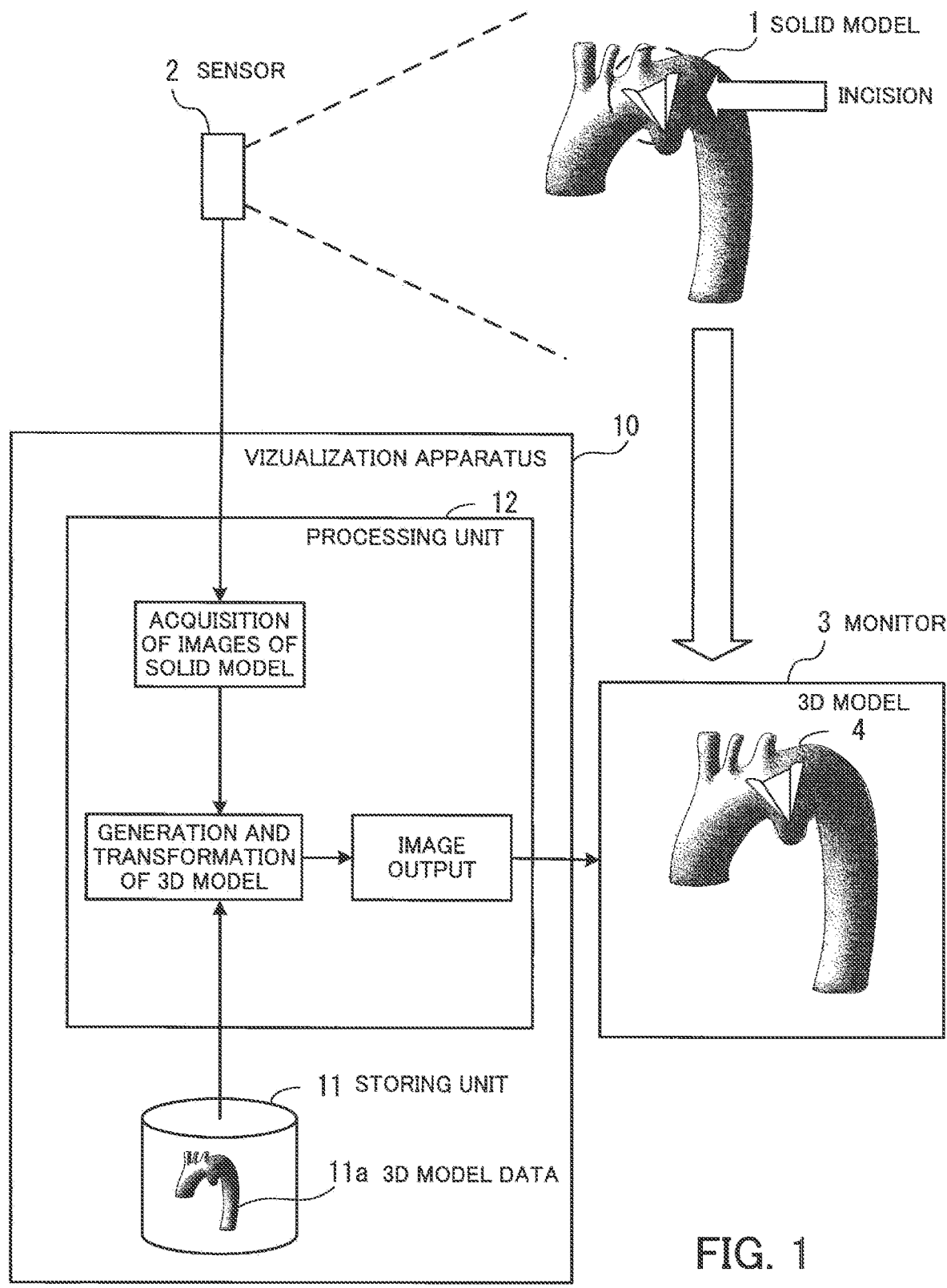
FIG. 1 illustrates an example of visualization by a visualization method according to a first embodiment.

FIG. 1 illustrates an example of visualization by a visualization method according to the first embodiment. The first embodiment uses, for example, a visualization apparatus 10 to visualize, when a solid model 1 of a human body part is transformed, the transformed morphology using a three-dimensional (3D) model 4. To implement this, the visualization apparatus 10 includes a storing unit 11 and a processing unit 12. The storing unit 11 is, for example, a memory or other storage device provided in the visualization apparatus 10. The processing unit 12 is, for example, a processor or an operation circuit provided in the visualization apparatus 10. The visualization apparatus 10 implements the visualization method, for example, by causing the processor to run a visualization program describing visualization processing.

The storing unit 11 stores therein 3D model data 11a representing a 3D shape of the human body part. The processing unit 12 detects a change in the shape of the solid model 1 based on images of the solid model 1 of the body part, captured by a sensor 2. The sensor 2 is, for example, a range image sensor. The range image sensor is able to measure the distance to the solid model 1, and image data acquired from the range image sensor represents the contour of the solid model 1. Note that the solid model 1 may be created, for example, by a 3D printer based on the 3D model data 11a.

Next, based on the 3D model data 11a, the processing unit 12 generates the 3D model 4, which reproduces the shape of the body part in virtual space. The processing unit 12 also transforms the 3D model 4 according to changes in the shape of the solid model 1. For example, the processing unit 12 recognizes the contour of the solid model based on image data acquired from the sensor 2, and transforms, if the contour changes, a corresponding part of the 3D model 4 so as to have the same shape as the solid model 1.

Subsequently, the processing unit 12 outputs an image of the transformed 3D model 4. For example, the processing unit 12 causes a monitor 3 to display the image of the 3D model 4.

Herewith, it is possible to transform the 3D model 4 in the virtual space in accordance with the transformation of the solid model 1. This allows more advanced linkage between the solid model 1 and the 3D model 4.

The advanced linkage between the solid model 1 and the 3D model 4 facilitates a doctor to comprehend an affected area and make preoperative confirmation of a region to be operated. That is, the doctor uses the solid model 1 of the patient's body part to gain an understanding of the size of the body part and the location on the surface to be incised. For example, the solid model 1 of a patient's internal organ is created by a 3D printer using an appropriate material and then provided for the doctor to determine, for example, the size and firmness of the organ through simulation on the tangible solid model 1 prior to real surgery. At this time, the doctor is also able to make an actual incision in the solid model 1 with a scalpel in order to confirm the location on the patient's internal organ to be cut open.

In such a case, the visualization apparatus 10 interactively reflects, in the 3D model 4, results of the action taken by the doctor on the solid model 1. For example, when an incision is made in the solid model 1, the visualization apparatus 10 transforms the shape of the 3D model 4 accordingly to reproduce the shape with the incision created. The 3D model 4 allows detailed reproduction, even of the internal structure, and the doctor is therefore able to identify details on, for example, whether the width and depth of the incision are appropriate (e.g. whether the incision goes beyond an area for incision), based on the 3D model 4 transformed corresponding to the transformation of the solid model 1.

The visualization apparatus 10 also visualizes a physical quantity associated with the transformation of the solid model 1. For example, the processing unit 12 calculates a physical quantity affected by a change in the shape of the solid model 1, and changes a display mode of the transformed part of the 3D model 4 according to the calculated physical quantity.

One example of such a physical quantity to be calculated is a stress exerted when a load is applied to the solid model 1. When a load is applied to a part of the solid model 1, the processing unit 12 transforms the 3D model 4 according to transformation of the solid model 1 caused by the applied load, and also calculates the stress exerted at a part transformed due to the application of the load. Then, the processing unit 12 outputs an image of the 3D model 4, which visualizes the stress. For example, the processing unit 12 visualizes the stress by projecting stress isolines (equal-stress lines) on the 3D model.

In addition, the visualization apparatus 10 is able to calculate a physical quantity based on results of a simulation using the 3D model data 11a. In that case, the storing unit 11 prestores therein physical quantity data representing results of a simulation of a first physical quantity, in which the 3D model data 11a is used. Based on the physical quantity data, the processing unit 12 calculates values of a second physical quantity in response to a change in the shape of the solid model 1. For example, the first physical quantity represented by the physical quantity data is the blood pressure in the body part. In this case, based on the physical quantity data, the processing unit 12 calculates, when an incision is made in the solid model 1, the velocity or acceleration of particles representing blood spurt from the incision as the second physical quantity.

Thus, a physical quantity is calculated based on results of a simulation in response to transformation of the solid model 1, and the physical quantity is visualized on a 3D model in virtual space. This facilitates easy understanding of the effect of an action taken on the solid model 1. For example, if a load is applied to the solid model 1, the stress is displayed on the monitor 3. If an incision is made in the solid model 1, how bleeding from the incision would occur is displayed on the monitor 3. In this manner, it is possible to provide doctors with information closer to reality by taking interactive manipulation on the solid model 1 as input.

(b) Second Embodiment

A second embodiment is described next. The second embodiment is directed to generating a solid model by a 3D printer based on 3D model data and linking the solid model to a 3D model in virtual space.

Figure 2:
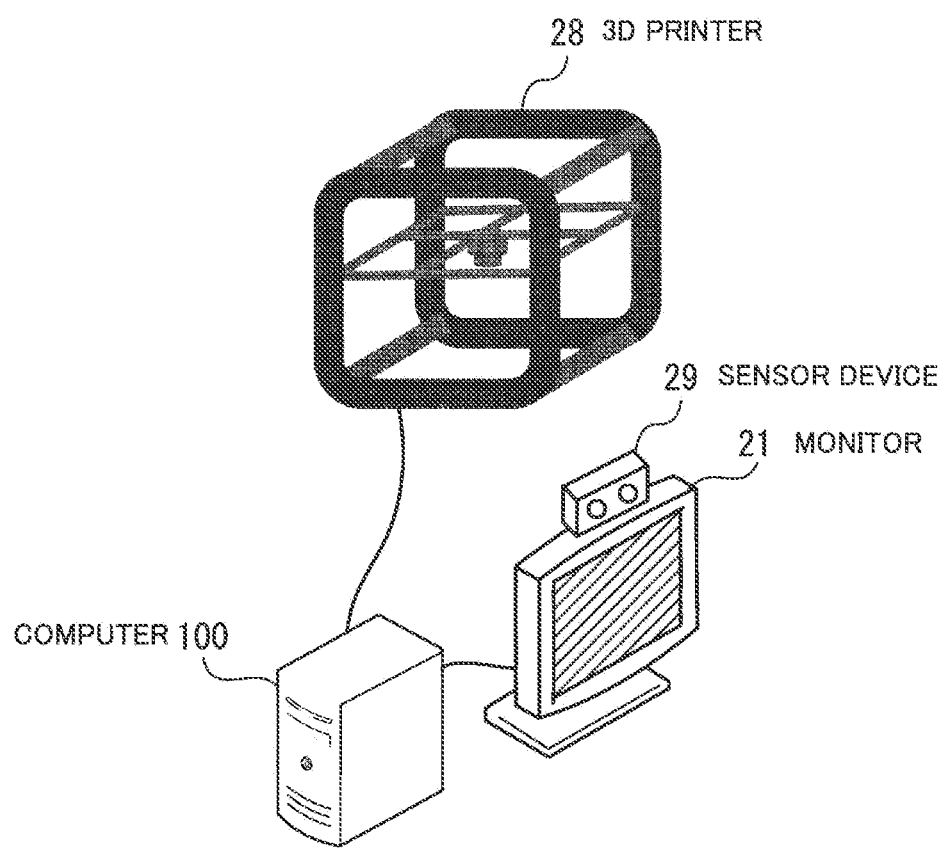
FIG. 2 illustrates an example of a system configuration according to a second embodiment.

FIG. 2 illustrates an example of a system configuration according to the second embodiment. A monitor 21, a 3D printer 28, and a sensor device 29 are connected to a computer 100. In the computer 100, 3D model data of a patient's body part (for example, aorta) is stored. The computer 100 exercises control over the 3D printer 28 to cause it to create a solid model of the patient's body part based on the 3D model data.

The sensor device 29 is used to detect the shape of an object in real space. For example, the sensor device 29 captures the shape of the object using a video camera, a range image sensor, an infrared sensor, or the like.

In response to rotation and transformation of a solid model output from the 3D printer, the computer 100 reflects information on the rotation and transformation in a 3D model in virtual space. The computer 100 is also able to run a stress simulation to thereby visualize quantitative information, such as stress and distortion values, on the 3D model. For example, the computer 100 displays scale information, information on coordinates of inflection points, information on stress and distortion isolines, information on fluctuations, for instance, in the pressure of the fluid (blood), and the like. Note that the computer 100 is an example of the visualization apparatus 10 according to the first embodiment.

Figure 3:
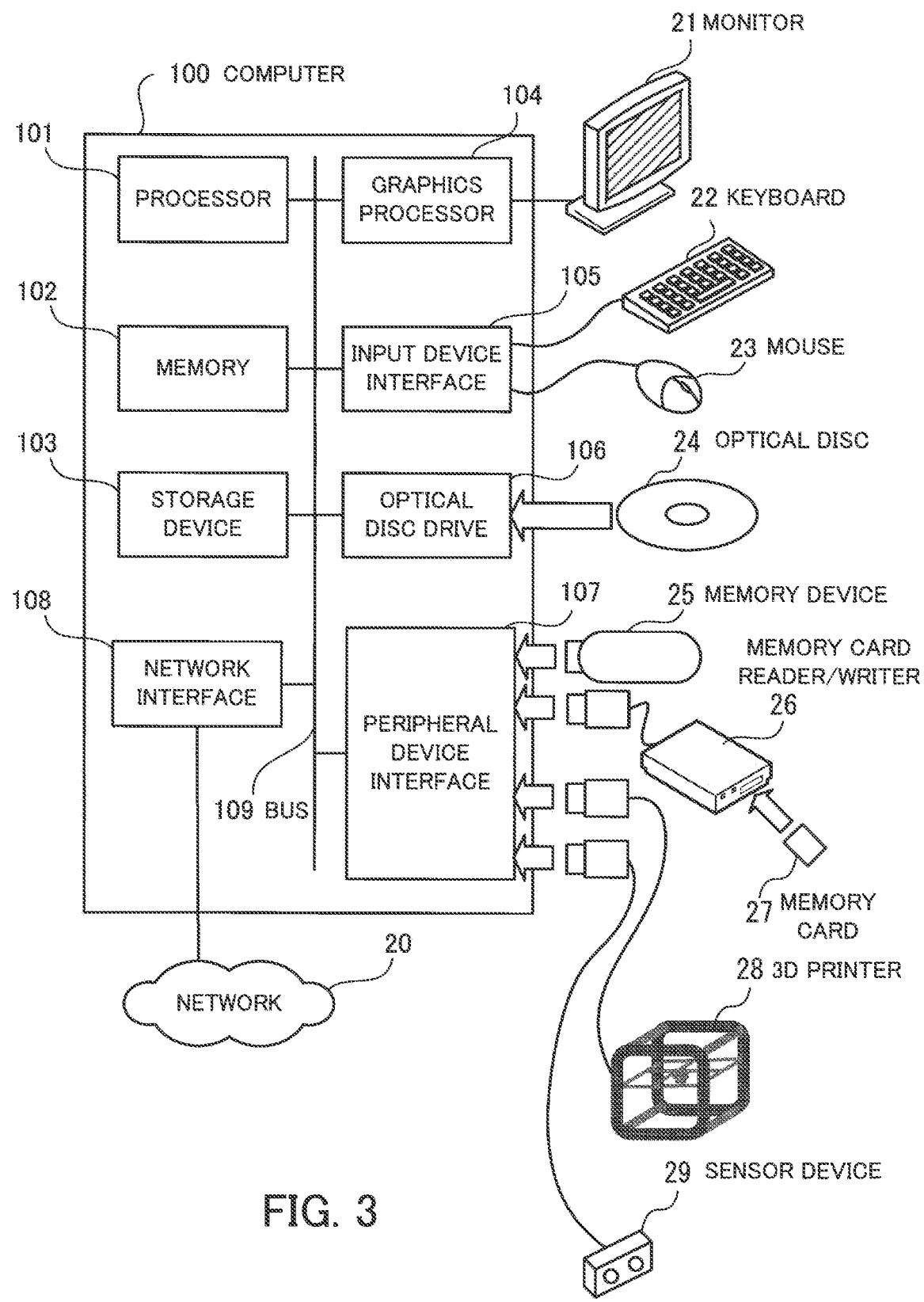
FIG. 3 illustrates an example of a hardware configuration of a computer.

FIG. 3 illustrates an example of a hardware configuration of the computer. The illustrated computer 100 has a processor 101 to control its entire operation. The processor 101 is connected to a memory 102 and other various devices and interfaces via a bus 109. The processor 101 may be a single processing device or a multiprocessor system including two or more processing devices, such as a central processing unit (CPU), micro processing unit (MPU), and digital signal processor (DSP). It is also possible to implement processing functions of the processor 101 and its programs wholly or partly into an application-specific integrated circuit (ASIC), programmable logic device (PLD), or other electronic circuits, or any combination of them.

The memory 102 serves as the primary storage device in the computer 100. Specifically, the memory 102 is used to temporarily store at least some of the operating system (OS) programs and application programs that the processor 101 executes, as well as various types of data to be used by the processor 101 for its processing. For example, the memory 102 may be implemented using a random access memory (RAM) or other volatile semiconductor memory devices.

Other devices on the bus 109 include a storage device 103, a graphics processor 104, an input device interface 105, an optical disc drive 106, a peripheral device interface 107, and a network interface 108.

The storage device 103 writes and reads data electrically or magnetically in or on its internal storage medium. The storage device 103 serves as a secondary storage device in the computer 100 to store program and data files of the operating system and applications. For example, the storage device 103 may be implemented using hard disk drives (HDD) or solid state drives (SSD).

The graphics processor 104, coupled to the monitor 21, produces video images in accordance with drawing commands from the processor 101 and displays them on a screen of the monitor 21. The monitor 21 may be, for example, an organic electro-luminescence (OEL) display or a liquid crystal display.

The input device interface 105 is connected to input devices, such as a keyboard 22 and a mouse 23, and supplies signals from those devices to the processor 101. The mouse 23 is a pointing device, which may be replaced with other kinds of pointing devices, such as a touchscreen, tablet, touchpad, and trackball.

The optical disc drive 106 reads out data encoded on an optical disc 24, by using laser light. The optical disc 24 is a portable storage medium on which data is recorded in such a manner as to be read by reflection of light. The optical disc 24 may be a digital versatile disc (DVD), DVD-RAM, compact disc read-only memory (CD-ROM), CD-Recordable (CD-R), or CD-Rewritable (CD-RW), for example.

The peripheral device interface 107 is a communication interface used to connect peripheral devices to the computer 100. For example, the peripheral device interface 107 may be used to connect a memory device 25, a memory card reader/writer 26, the 3D printer 28, and the sensor device 29. The memory device 25 is a data storage medium having a capability to communicate with the peripheral device interface 107. The memory card reader/writer 26 is an adapter used to write data to or read data from a memory card 27, which is a data storage medium in the form of a small card.

The network interface 108 is connected to a network 20 so as to exchange data with other computers or network devices (not illustrated).

The above-described hardware platform may be used to implement the processing functions of the computer 100 according to the second embodiment. The same hardware configuration of the computer 100 of FIG. 3 may similarly be applied to the foregoing visualization apparatus 10 of the first embodiment.

The computer 100 provides various processing functions of the second embodiment by, for example, executing computer programs stored in a computer-readable storage medium. A variety of storage media are available for recording programs to be executed by the computer 100. For example, the computer 100 may store program files in its own storage device 103. The processor 101 reads out at least part of those programs from the storage device 103, loads them into the memory 102, and executes the loaded programs. Other possible storage locations for the server programs include the optical disc 24, the memory device 25, the memory card 27, and other portable storage media. The programs stored in such a portable storage medium are installed in the storage device 103 under the control of the processor 101, so that they are ready to be executed upon request. It may also be possible for the processor 101 to execute program codes read out of a portable storage medium, without installing them in its local storage devices.

The hardware configuration depicted in FIG. 3 allows the computer 100 to create a solid model based on 3D model data and transform a 3D model in virtual space in accordance with transformation of the solid model.

Figure 4:
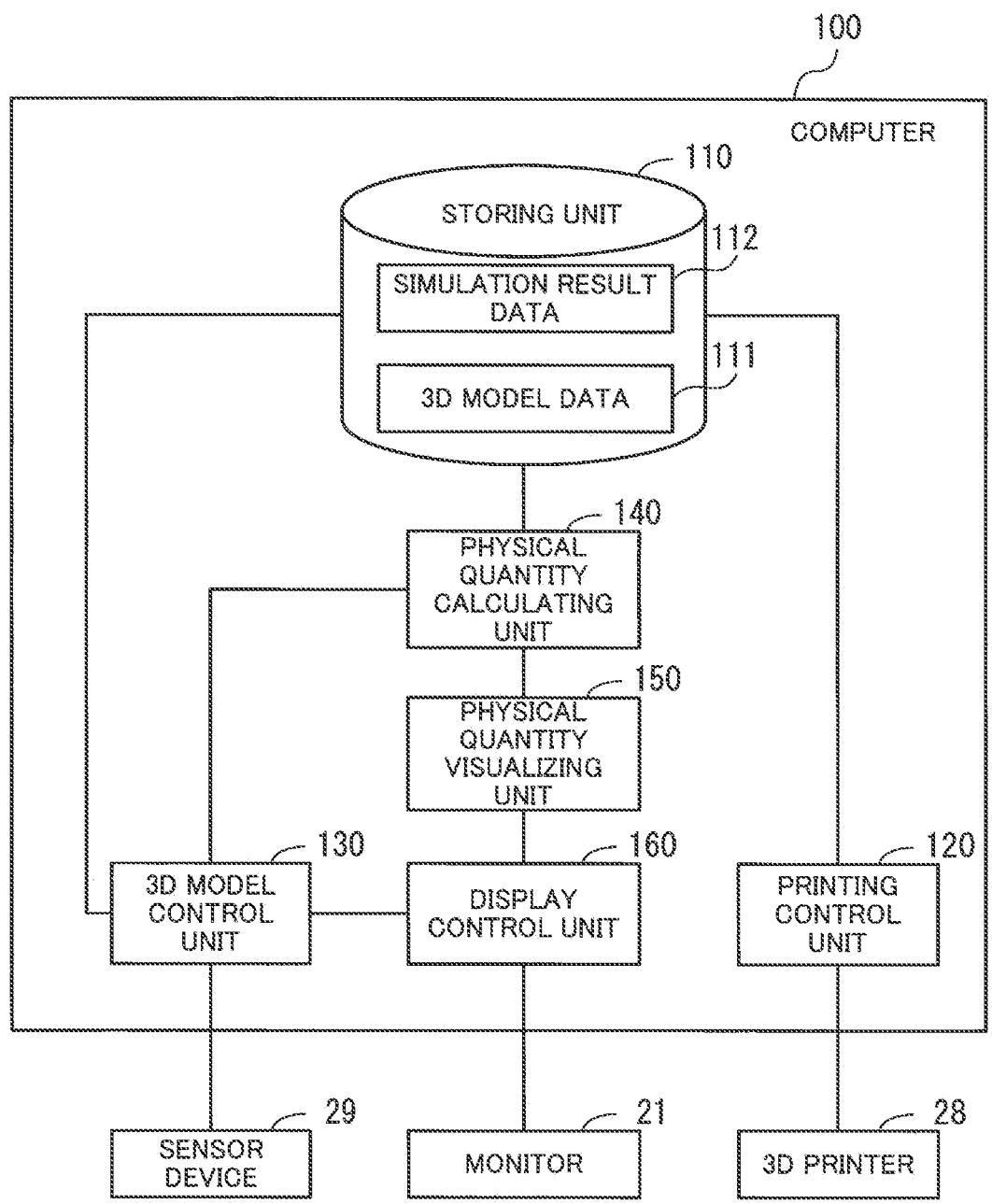
FIG. 4 is a block diagram illustrating an example of functions provided in the computer.

FIG. 4 is a block diagram illustrating an example of functions provided in the computer. The computer 100 includes a storing unit 110, a printing control unit 120, a 3D model control unit 130, a physical quantity calculating unit 140, a physical quantity visualizing unit 150, and a display control unit 160.

The storing unit 110 stores therein 3D model data 111 and simulation result data 112. The 3D model data 111 is data for representing the solid form of a patient's internal organ. For example, the 3D model data 111 represents the solid form using polygonal or polyhedral elements. The simulation result data 112 is data on physical quantities obtained from a computer simulation of the patient's internal organ, such as the heart. For example, the simulation result data 112 includes values associated with pressure in blood vessels.

The printing control unit 120 exercises control over the 3D printer 28 to cause it to create a solid model with a shape represented by the 3D model data 111.

In accordance with the shape of the solid model detected by the sensor device 29, the 3D model control unit 130 changes the shape represented by the 3D model data 111. The 3D model control unit 130 transmits the 3D model data 111 representing a transformed 3D model to the physical quantity calculating unit 140 and the display control unit 160.

The physical quantity calculating unit 140 calculates, based on the simulation result data 112, physical quantities (stress, velocity or acceleration of blood particles coming out, and so on) in accordance with the transformation of the 3D model. The physical quantity calculating unit 140 transmits the calculated physical quantities to the physical quantity visualizing unit 150.

The physical quantity visualizing unit 150 generates image data that visualizes the physical quantities calculated by the physical quantity calculating unit 140. The physical quantity visualizing unit 150 transmits the generated image data to the display control unit 160.

The display control unit 160 displays, based on the data of the 3D model (e.g. polygon model) sent from the 3D model control unit 130, the transformed 3D model on the monitor 21. In addition, based on the image data representing physical quantities, sent from the physical quantity visualizing unit 150, the display control unit 160 also displays image data representing the physical quantities, superimposed over an image of the 3D model.

It is noted that the solid lines interconnecting functional blocks in FIG. 4 represent some of their communication paths. A person skilled in the art would appreciate that there may be other communication paths in actual implementations. Each functional block seen in FIG. 4 may be implemented as a program module, so that a computer executes the program module to provide its encoded functions.

Next described are further details of the data stored in the storing unit 110.

Figure 5:
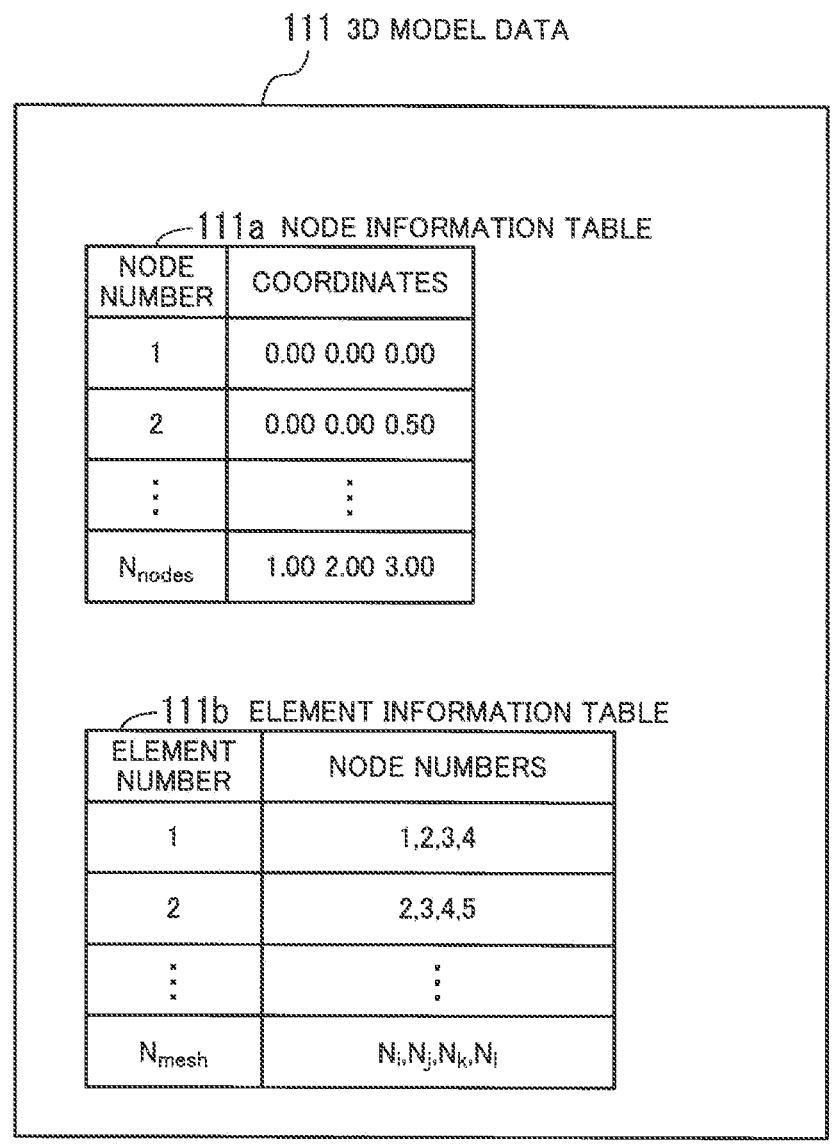
FIG. 5 illustrates an example of a data structure of 3D model data.

FIG. 5 illustrates an example of a data structure of the 3D model data. The 3D model data 111 includes, for example, a node information table 111a and an element information table 111b. The node information table 111a lists, for each node, a node number and coordinates representing the location of the node. The coordinates of each node in the node information table 111a indicate the location of the node in pre-simulation state. The element information table 111b lists, for each element, an element number and node numbers of nodes that are vertices of a tetrahedral element.

Based on the data stored in the storing unit 110 of FIG. 5, a 3D aorta model is generated. The 3D model data 111 of FIG. 5 represents the 3D model using polyhedral elements; however, the 3D model control unit 130 constructs polygons on a surface at the boundary to the outside of the 3D model to thereby generate a polygon model based on the 3D model data 111.

FIG. 6 illustrates an example of the simulation result data. The simulation result data 112 includes aorta data sets 112a, 112b, 112c, and so on for individual time steps, each of which is the point of time at which results of a single simulation were recorded. Each of the aorta data sets 112a, 112b, 112c, and so on is information indicating aortic state at the corresponding time step.

For example, the aorta data sets 112a, 112b, 112c, and so on individually list the location of an element or node and the value of one or more physical quantities (e.g. pressure), in association with each element/node identifier (ID). Note that the location of an element is, for example, the position of the center of gravity of a tetrahedral element. In addition, as for a single physical quantity, values may be given for both the elements and the nodes, or for only either one of them.

Using the aforementioned system, it is possible to link the 3D model in virtual space to the solid model.

Figure 7:
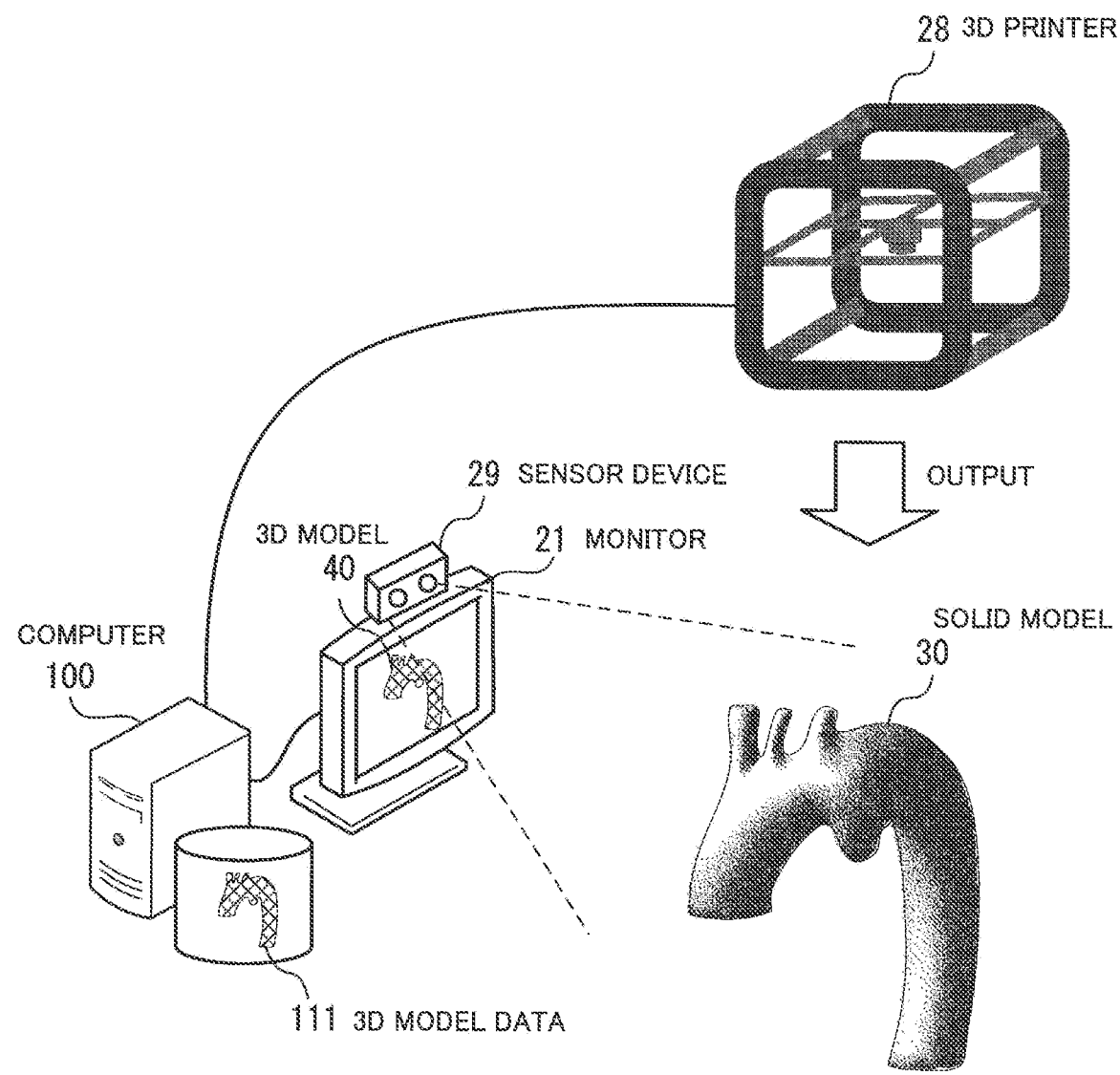
FIG. 7 illustrates an example of control of linking a 3D model to a solid model.

FIG. 7 illustrates an example of control of linking a 3D model to a solid model. Based on input from the user, the computer 100 instructs the 3D printer 28 to generate a solid model 30 based on the 3D model data 111. The 3D printer 28 outputs the solid model 30 according to the instruction.

When receiving input for displaying a 3D model corresponding to the solid model 30, the computer 100 comprehends the position, orientation, and shape of the solid model 30 according to images captured by the sensor device 29. Then, the computer 100 builds, based on the 3D model data 111, a 3D model 40 in virtual space, corresponding to the position, orientation, and shape of the solid model 30, and displays the 3D model 40 on the monitor 21.

The following description provides specifics of a procedure for linking the 3D model 40 in virtual space to the solid model 30.

Figure 8:
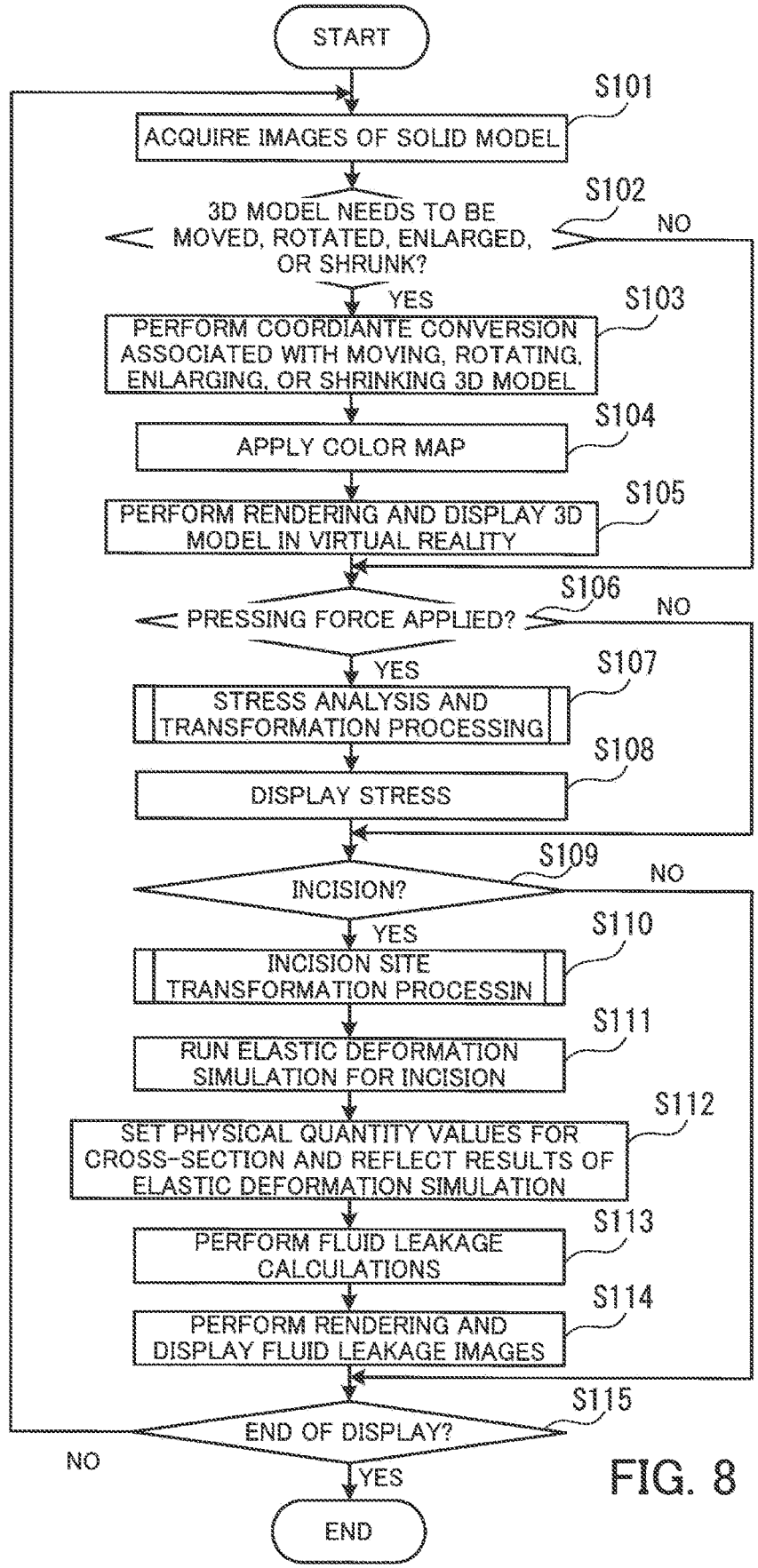
FIG. 8 is a flowchart illustrating an example of a procedure for linking the 3D model to the solid model.

FIG. 8 is a flowchart illustrating an example of the procedure for linking the 3D model to the solid model. The procedure in FIG. 8 is described below in the order of step numbers.

[Step S101] The 3D model control unit 130 acquires images of the solid model 30 from the sensor device 29.

[Step S102] The 3D model control unit 130 determines whether to move, rotate, enlarge, or shrink the 3D model 40 in accordance with the solid model 30. For example, when the solid model 30 has been displaced or rotated, the 3D model control unit 130 determines to move or rotate the 3D model 40. In this regard, the 3D model control unit 130 determines the position, orientation, and shape of the solid model 30 based on images captured, for example, by a video camera, a range image sensor, or an infrared sensor built in the sensor device 29. Then, if the position of the solid model 30 has been changed from the last position, the 3D model control unit 130 determines that the solid model 30 has been displaced. In addition, the orientation of the solid model 30 has been changed from the last orientation, the 3D model control unit 130 determines that the solid model 30 has been rotated. Further, when receiving an enlargement or reduction instruction from the user, for example, through mouse interaction, the 3D model control unit 130 determines to enlarge or shrink the 3D model 40.

When the 3D model 40 needs to be moved, rotated, enlarged, or shrunk, the 3D model control unit 130 proceeds to step S103. On the other hand, when the 3D model 40 need not be moved, rotated, enlarged, or shrunk, the 3D model control unit 130 proceeds to step S106.

[Step S103] The 3D model control unit 130 performs coordinate conversion associated with moving, rotating, enlarging, or shrinking the 3D model 40. For example, the 3D model control unit 130 moves the position of a virtual camera, which provides the point of view in virtual space, to thereby change the position of the 3D model 40 relative to the virtual camera. Then, the 3D model control unit 130 converts the coordinates of each node of the 3D model 40 to those in a coordinate system based on the virtual camera. This coordinate conversion is implemented, for example, by mapping transformation using a matrix.

[Step S104] The 3D model control unit 130 applies a color map to a surface mesh of the 3D model 40. For example, the 3D model control unit 130 has colors preset for the surface of the 3D model 40. Then, the 3D model control unit 130 sets colors of the surface mesh of the 3D model 40 to those designated in advance.

[Step S105] The 3D model control unit 130 performs rendering of the 3D model 40. The rendering generates image data representing the 3D model 40. Then, the 3D model control unit 130 transmits the image data representing the 3D model 40 to the display control unit 160. The display control unit 160 displays, based on the image data of the 3D model 40, an image of the 3D model 40 on the monitor 21.

[Step S106] The 3D model control unit 130 determines if a pressing force is applied to a part of the 3D model 40. For example, when a particular part of the 3D model 40 is indicated by the user, for instance, through mouse interaction, the 3D model control unit 130 determines that the part is pressed. Looking at another example, the 3D model control unit 130 acquires images of a fingertip of the user from the sensor device 29, and determines, when the user presses a particular part of the solid model 30 with the fingertip, that a part of the 3D model 40 corresponding to the particular part is pressed.

If a pressing force is determined to be applied, the 3D model control unit 130 proceeds to step S107. If no pressing force is determined to be applied, the 3D model control unit 130 proceeds to step S109.

Note that in the case where a pressing force is determined to be applied, the 3D model control unit 130 transmits, to the physical quantity calculating unit 140, the location of the part of the 3D model 40, subjected to the pressing force, and the amount of the force applied. For example, when the part subjected to the pressing force is indicated using a mouse, the 3D model control unit 130 interprets a value proportional to the duration of a button on the mouse being pressed as the amount of the applied force. In the case where the user presses the solid model 30 with a fingertip, the 3D model control unit 130 interprets the amount of the surface of the solid model 30 being pressed in by the user's fingertip as the amount of the applied force.

[Step S107] The 3D model control unit 130, the physical quantity calculating unit 140, and the physical quantity visualizing unit 150 cooperate with each other to perform stress analysis and transformation processing for the part subjected to the pressing force. Details of the stress analysis processing are described later (see FIG. 9).

[Step S108] The display control unit 160 displays an image representing stress, superimposed over the 3D model 40 with the part being pressed.

[Step S109] The 3D model control unit 130 determines, based on images acquired from the sensor device 29, whether the solid model 30 has an incision. If the solid model 30 has an incision, the 3D model control unit 130 proceeds to step S110. On the other hand, if the solid model 30 has no incision, the 3D model control unit 130 proceeds to step S115.

[Step S110] The 3D model control unit 130 performs incision site transformation processing. Details of the incision site transformation processing are described later (see FIG. 11).

[Step S111] The 3D model control unit 130 runs an elastic deformation simulation for the incision based on the shape of the open incision.

[Step S112] The 3D model control unit 130 sets, for the cross-section of the incision, values of a physical quantity (e.g. deformation stress) represented by the simulation result data 112. The 3D model control unit 130 also reflects results of the elastic deformation simulation in the 3D model 40. For example, the 3D model control unit 130 adds values of a physical quantity obtained by the elastic deformation simulation to those of the physical quantity represented by the simulation result data 112.

[Step S113] If the simulation result data 112 includes results of a blood fluid simulation, the physical quantity calculating unit 140 performs calculations associated with the fluid leakage from the incision. For example, the physical quantity calculating unit 140 calculates the amount and acceleration of blood spurt from the incision.

Equation (1) below includes a particle's acceleration vector a to be found, with density p, particle volume V, leakage area S (area of a fluid boundary polygon), pressure p of an arbitrary element, and a polygon's normal vector n. The physical quantity calculating unit 140 obtains the acceleration vector a by Equation (2), derived by rearranging Equation (1).

$$\rho V a = S p n \quad (1)$$

$$a = \frac{1}{\rho V} S p n \quad (2)$$

The density p takes, for example, a representative value of blood density of 1.05 g/cm$^3$. The particle volume V is a constant value given by the user.

As a result, as for each polygon on the fluid boundary, as many particles as specified by the user are emitted at the acceleration a. The number of particles specified by the user is defined as Equation (3) below.

$$m = \frac{l}{\Delta t} \quad (3)$$

In Equation (3), m is the number of particles, Δt is the unit time set by the user, and l is the number of particles emitted per unit time in images. As the number of particles m is determined by Equation (3), particles are emitted along the normal vector n at the acceleration a. Note that the physical quantity calculating unit 140 may take gravity into account in the calculation. In that case, the physical quantity calculating unit 140 calculates, for example, a resultant vector formed by adding the acceleration of gravity to the acceleration a. In addition, the physical quantity calculating unit 140 may calculate trajectories of particles in such a manner that the particles are accelerated over a distance corresponding to the radius of a blood vessel and then fall free under gravity after being discharged outside of the 3D model 40.

The physical quantity visualizing unit 150 generates image data representing images that depict the calculated blood leakage, and transmits the generated image data to the display control unit 160.

[Step S114] The display control unit 160 performs rendering of images depicting the fluid leakage and displays them superimposed over the 3D model 40.

[Step S115] The display control unit 160 determines whether to have received, from the user, an end-of-display instruction to end the image display. If an end-of-display instruction has been received, the display control unit 160 ends the process of displaying the 3D model 40. If no end-of-display instruction is received, the display control unit 160 returns to step S101.

In the above-described manner, results of actions taken by the user on the solid model 30 are reflected in the 3D model 40 in virtual space.

Next, a detailed description is given of a procedure of the stress analysis and transformation processing.

Figure 9:
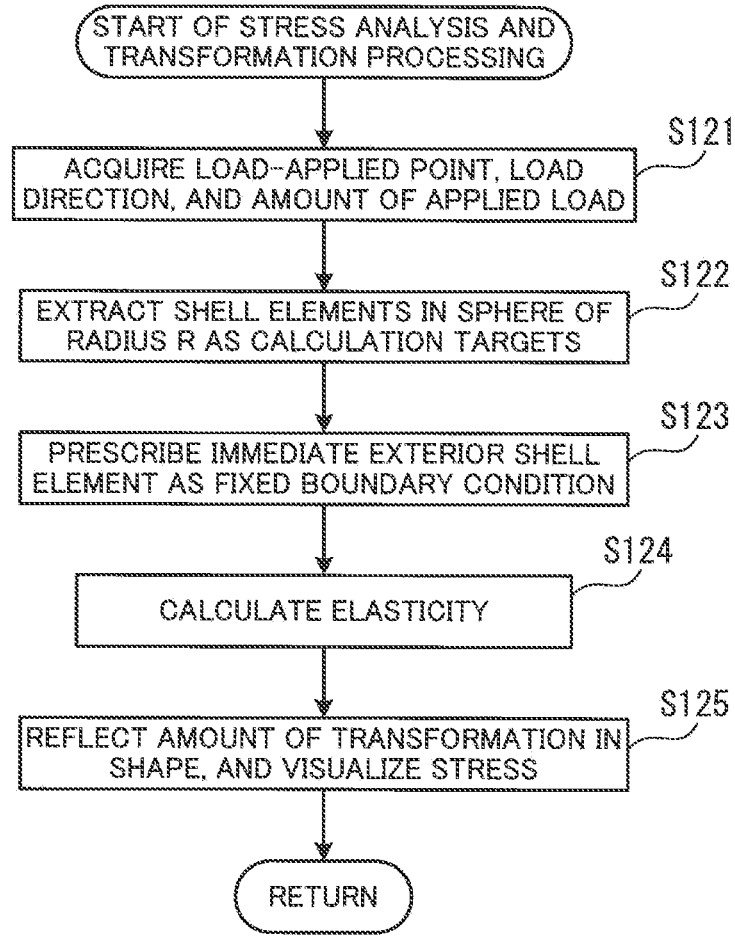
FIG. 9 is a flowchart illustrating an example of a procedure of stress analysis and transformation processing.

FIG. 9 is a flowchart illustrating an example of the procedure of the stress analysis and transformation processing. The procedure in FIG. 9 is described below in the order of step numbers.

[Step S121] The 3D model control unit 130 acquires a point to which a load is applied (hereinafter simply referred to as "load-applied point"), a load direction, and the amount of the load applied (the magnitude of the force), for instance, based on a press-down action. For example, when a press-down action using a mouse is performed on the 3D model 40, the 3D model control unit 130 interprets a point on the 3D model 40 indicated by the mouse pointer as the load-applied point, and a direction toward the inside of the aorta from the load-applied point as the load direction. The 3D model control unit 130 assigns, for example, a predetermined value to the amount of the applied load. Alternatively, the 3D model control unit 130 may employ a value proportional to the duration of a button on the mouse being pressed down as the amount of the applied load.

[Step S122] The physical quantity calculating unit 140 extracts, from the 3D model 40, shell elements included in a sphere of radius R (R is a positive real number) from the load-applied point as calculation targets. The shell elements are flat and triangular elements, and correspond, for example, to polygons in a polygonal model. For instance, the physical quantity calculating unit 140 extracts, amongst nodes on the surface of the 3D model 40, a plurality of nodes within R in distance from the load-applied point, and uses facets formed by combinations of the extracted nodes as the calculation-target shell elements.

[Step S123] The physical quantity calculating unit 140 prescribes, as for each of the extracted shell elements, its immediate exterior shell element as a fixed boundary condition. That is, for each extracted shell element, the physical quantity calculating unit 140 fixes a value, such as the location of its immediate exterior shell element.

[Step S124] The physical quantity calculating unit 140 calculates the elasticity of each of the extracted shell elements. For example, the physical quantity calculating unit 140 performs elasto-plastic analysis of the flat shell element to determine the elasticity. In that case, the physical quantity calculating unit 140 defines the equivalent stress as Equation (4) below.

$$\text{EQUIVALENT STRESS} = \sqrt{\sigma_x^2 - \sigma_x \sigma_y + \sigma_y^2 + \tau_{xy}^2} \quad (4)$$

In Equation (4), $\sigma_x$ is the x-component (component in the x-axis) of the normal stress; $\sigma_y$ is the y-component (component in the y-axis) of the normal stress; $\tau_{xy}$ is the shear stress in the x-axis direction in a plane whose normal line is the y-axis. In addition, the physical quantity calculating unit 140 defines a load increment vector $\Delta F$ as Equation (5) below.

$$\Delta F = \Delta \lambda F \quad (5)$$

In Equation (5), F is the load applied to the load-applied point, and $\Delta\lambda$ is the load increment rate set in advance. The load increment rate $\Delta\lambda$ is a real number less than or equal to 1, such as 1/100 and 1/1000. The physical quantity calculating unit 140 first solves Equation (6) below, tangent stiffness equation, in terms of a displacement increment vector U.

$$K\Delta U = \Delta F \quad (6)$$

In Equation (6), K is the elastic stiffness matrix. The physical quantity calculating unit 140 calculates, based on the displacement increment vector U, stress increments $\Delta\sigma_x$, $\Delta\sigma_y$, and $\Delta\tau_{xy}$ in the individual axial directions at Gauss integration points of each shell element. The physical quantity calculating unit 140 calculates the stress increments $\Delta\sigma_x$, $\Delta\sigma_y$, and $\Delta\tau_{xy}$ each time the load is increased by the load increment vector $\Delta F$, and then plugs cumulative values of the individual stress increments $\Delta\sigma_x$, $\Delta\sigma_y$, and $\Delta\tau_{xy}$ into Equation (4) as $\sigma_x$, $\sigma_y$, and $\tau_{xy}$, respectively, to obtain the equivalent stress. The physical quantity calculating unit 140 prescribes the equivalent stress corresponding to the load added in the calculation as the ultimate stress of each shell element. In addition, the physical quantity calculating unit 140 calculates the ultimate displacement (the amount of change in position) of each shell element based on the displacement increment vector U obtained each time the load is increased by the load increment vector $\Delta F$. The displacements of the individual shell elements represent the amount of transformation of the 3D model 40.

[Step S125] The 3D model control unit 130 reflects the amount of transformation calculated by the physical quantity calculating unit 140 in the shape of the 3D model 40. That is, the 3D model control unit 130 transforms the load-applied point and its surrounding in the 3D model 40 by the calculated amount of transformation. In addition, the physical quantity visualizing unit 150 generates image data representing the stress applied to the transformed part. For example, the physical quantity visualizing unit 150 sets, for the transformed part, colors representing the magnitude of the stress.

In the above-described manner, the 3D model 40 is transformed corresponding to the stress, and visualization of the stress is also implemented.

Figure 10:
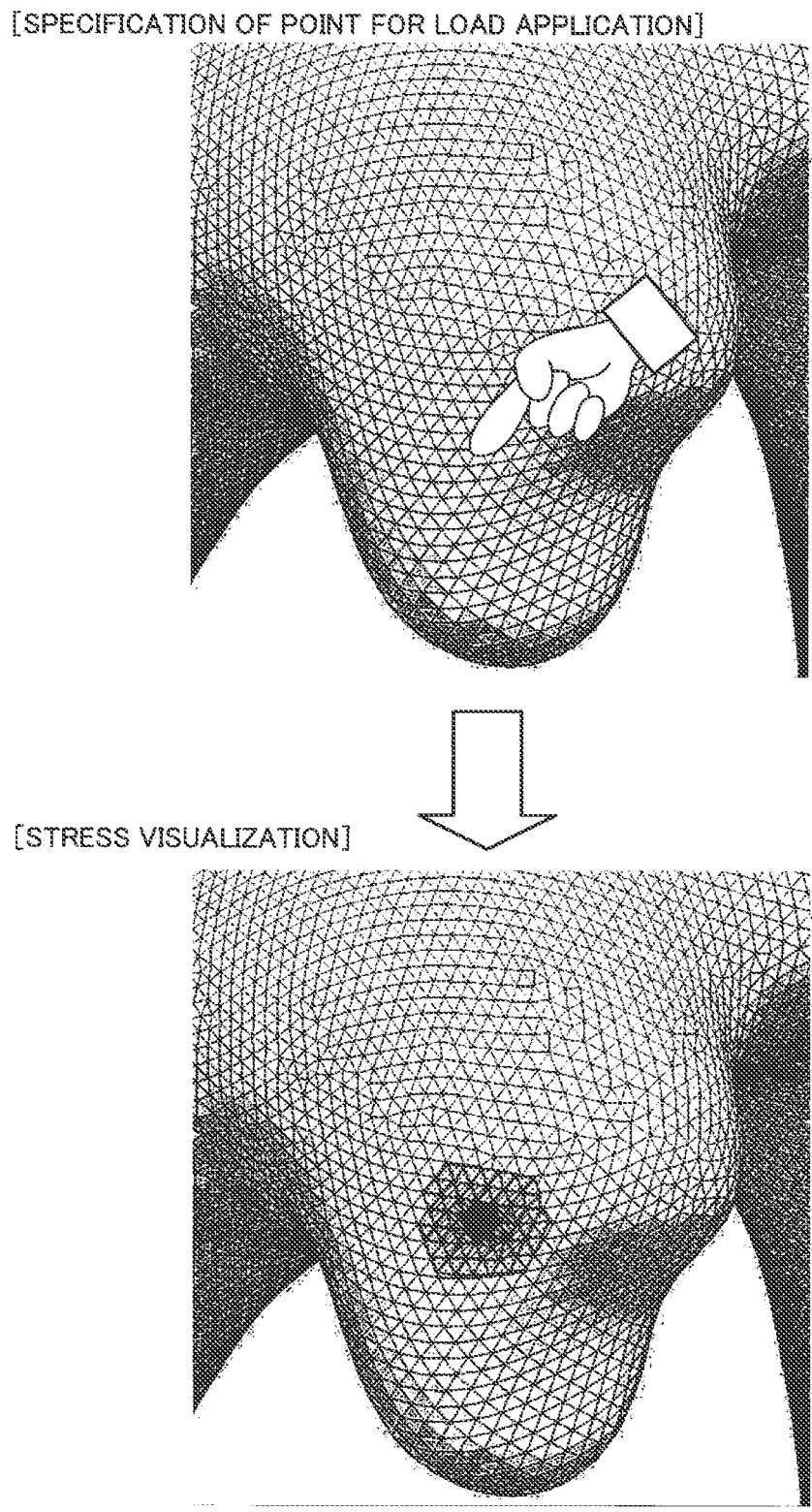
FIG. 10 illustrates an example of stress visualization.

FIG. 10 illustrates an example of stress visualization. The upper half of FIG. 10 depicts specification of a point on the 3D model 40, to which load is to be applied. The lower half of FIG. 10 depicts an example of the stress visualization. In the example of FIG. 10, darker colors are assigned to regions with stronger stress. Visualizing the stress at and around the load-applied point on the 3D model 40 displayed in accordance with the solid model 30 in this manner provides doctors, for example, with haptic or tactile experiences with the solid model 30 and identification of stress distribution when a part of the solid model 30 is pressed.

For example, the 3D model control unit 130 is able to detect the position of a fingertip of a doctor touching the solid model 30 and interpret the position as a load-applied point. In that case, when the doctor presses a part of the solid model 30, the distribution of stress at and around the pressed part is displayed on the monitor 21.

Next, a detailed description is given of the incision site transformation processing.

Figure 11:
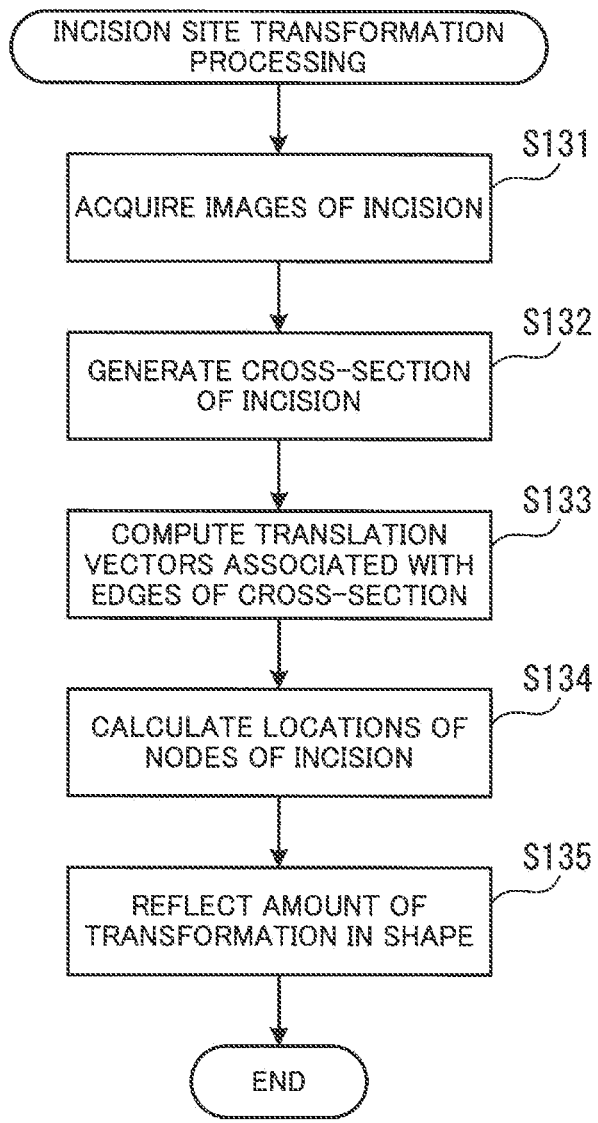
FIG. 11 is a flowchart illustrating an example of a procedure of incision site transformation processing.

FIG. 11 is a flowchart illustrating an example of a procedure of the incision site transformation processing. The procedure in FIG. 11 is described below in the order of step numbers.

[Step S131] The 3D model control unit 130 acquires images of an incision from the sensor device 29.

[Step S132] The 3D model control unit 130 generates a cross-section of the incision. For example, the 3D model control unit 130 generates new nodes along the incision and a mesh including the nodes.

[Step S133] The 3D model control unit 130 computes translation vectors associated with edges of the cross-section.

[Step S134] The 3D model control unit 130 calculates, based on the translation vectors, locations of the nodes of the incision.

[Step S135] The 3D model control unit 130 reflects the amount of transformation in the 3D model 40.

Figure 12:
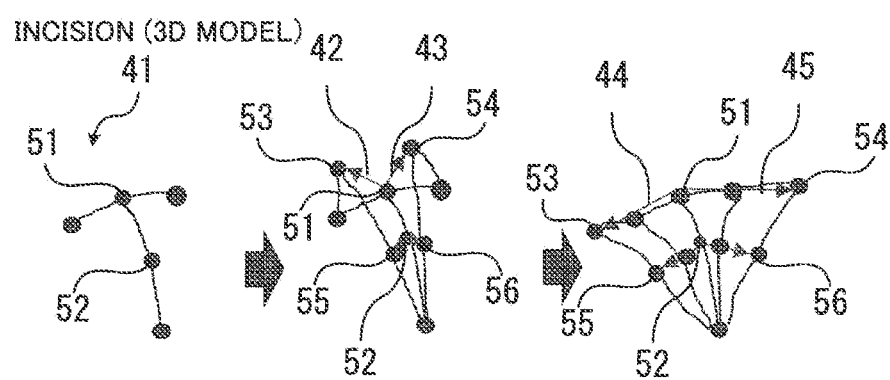
FIG. 12 illustrates an example of computation of translation vectors.

FIG. 12 illustrates an example of computation of translation vectors. For example, the 3D model control unit 130 identifies nodes 51 and 52 on an incision 41 of the 3D model 40. Next, when recognizing displacement of edges of an incision on the solid model 30 based on images captured by the sensor device 29, the 3D model control unit 130 generates translation vectors of the incision edges from the nodes 51 and 52 on the incision 41. For example, as for the node 51, two translation vectors 42 and 43 rooted at the node 51 are generated. Then, the 3D model control unit 130 generates new nodes 53 to 56 at locations displaced from the nodes 51 and 52 according to the generated translation vectors.

If the edges of the incision of the solid model 30 are further displaced, then the 3D model control unit 130 detects again the displacement of the edges of the incision and generates translation vectors of the incision edges, starting from the nodes 51 and 52 on the incision 41. For example, as for the node 51, two translation vectors 44 and 45 rooted at the node 51 are generated. Then, the 3D model control unit 130 translates the nodes 53 to 56 to locations displaced from the nodes 51 and 52 according to the generated translation vectors.

When the shape of the incision is changed, the physical quantity calculating unit 140 runs an elastic deformation simulation of the incision.

Figure 13:
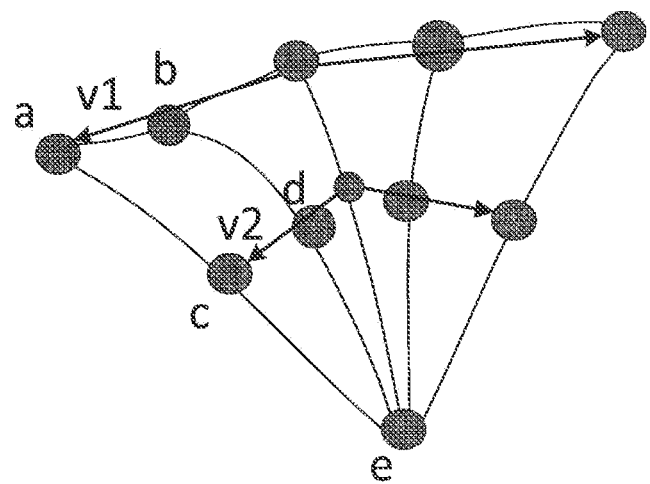
FIG. 13 illustrates an elastic deformation simulation.

FIG. 13 illustrates an elastic deformation simulation. Assume that movement velocity vectors v1 and v2 are defined in displacement of a plane abdec in FIG. 13. In this case, for the incision 41 of the 3D model 40, transformation is made, to polygons constituting the plane abdec, at a side bde. The physical quantity calculating unit 140 performs an elastic analysis using shell elements for polygons in contact with the plane abdec. In this case, the transformation stress depends on v1/t and v2/t (t is the time to complete the transformation).

With the above-described method, when a doctor makes an incision in the solid model 30, the transformation is reflected in the 3D model 40 in virtual space, and transformation stress calculated by an elastic deformation simulation is displayed on the 3D model 40. The display of the transformation stress allows the doctor to determine whether the location of the incision is appropriate based on the distribution of the transformation stress. For example, if a region subjected to the transformation stress includes an area of infarction, the doctor is able to determine that it is not appropriate to make an incision in the region.

Figure 14:
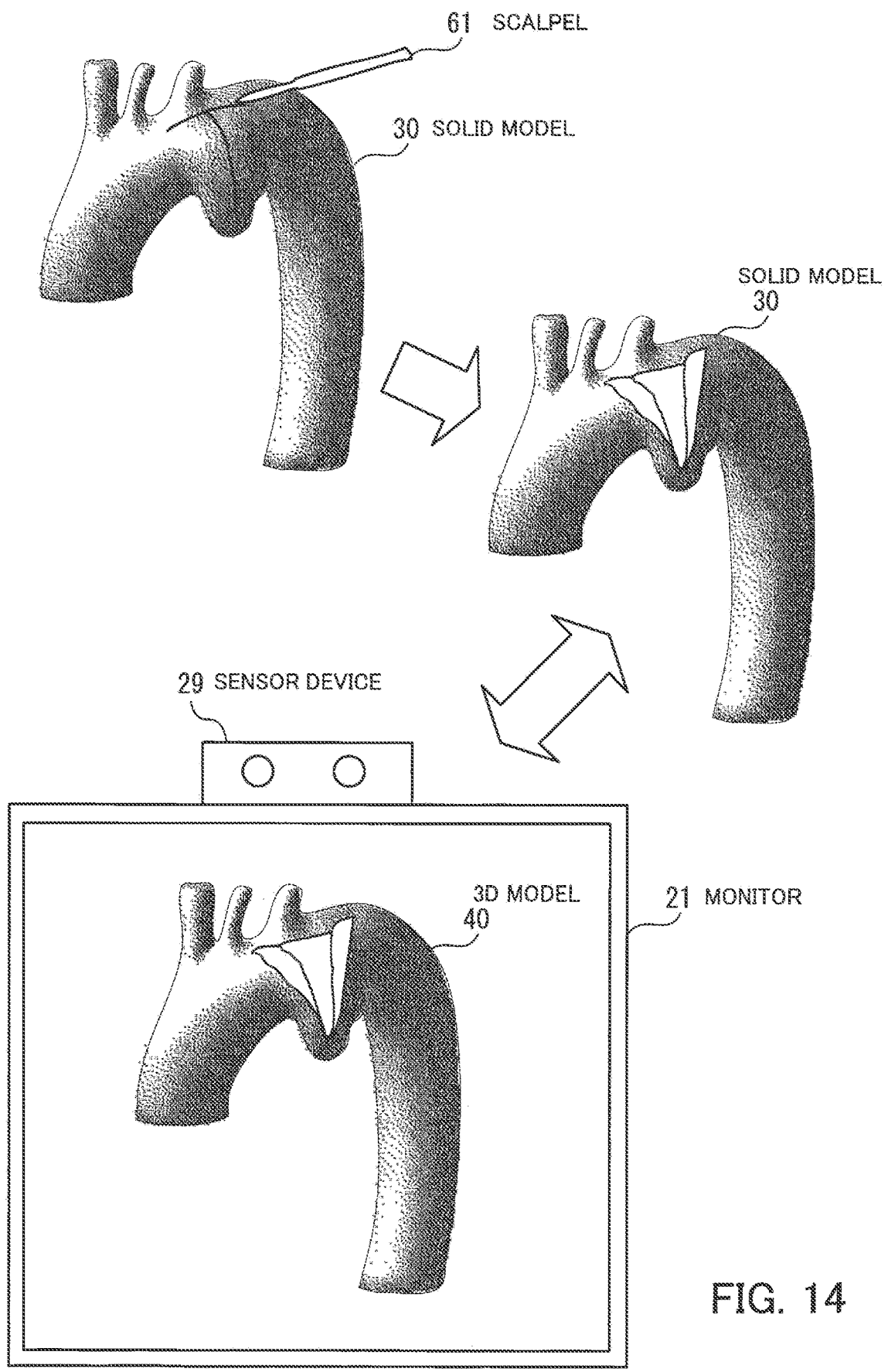
FIG. 14 illustrates a display example of an incision.

FIG. 14 illustrates a display example of an incision. For example, the doctor makes an incision in the solid model 30 with a scalpel 61. Images of the shape of the incision are captured by the sensor device 29 and then sent to the computer 100. The 3D model control unit 130 of the computer 100 transforms the 3D model 40 in such a manner as to have an incision of the same shape as that of the incision in the solid model 30. Subsequently, the transformed 3D model 40 is displayed on the monitor 21. On the displayed 3D model 40, the magnitude of the transformation stress is graphically represented by different colors.

With the incision being made, the physical quantity calculating unit 140 performs calculations associated with fluid leakage. Then, it is possible to display how the fluid (blood) sheds from the incision on the monitor 21.

Figure 15:
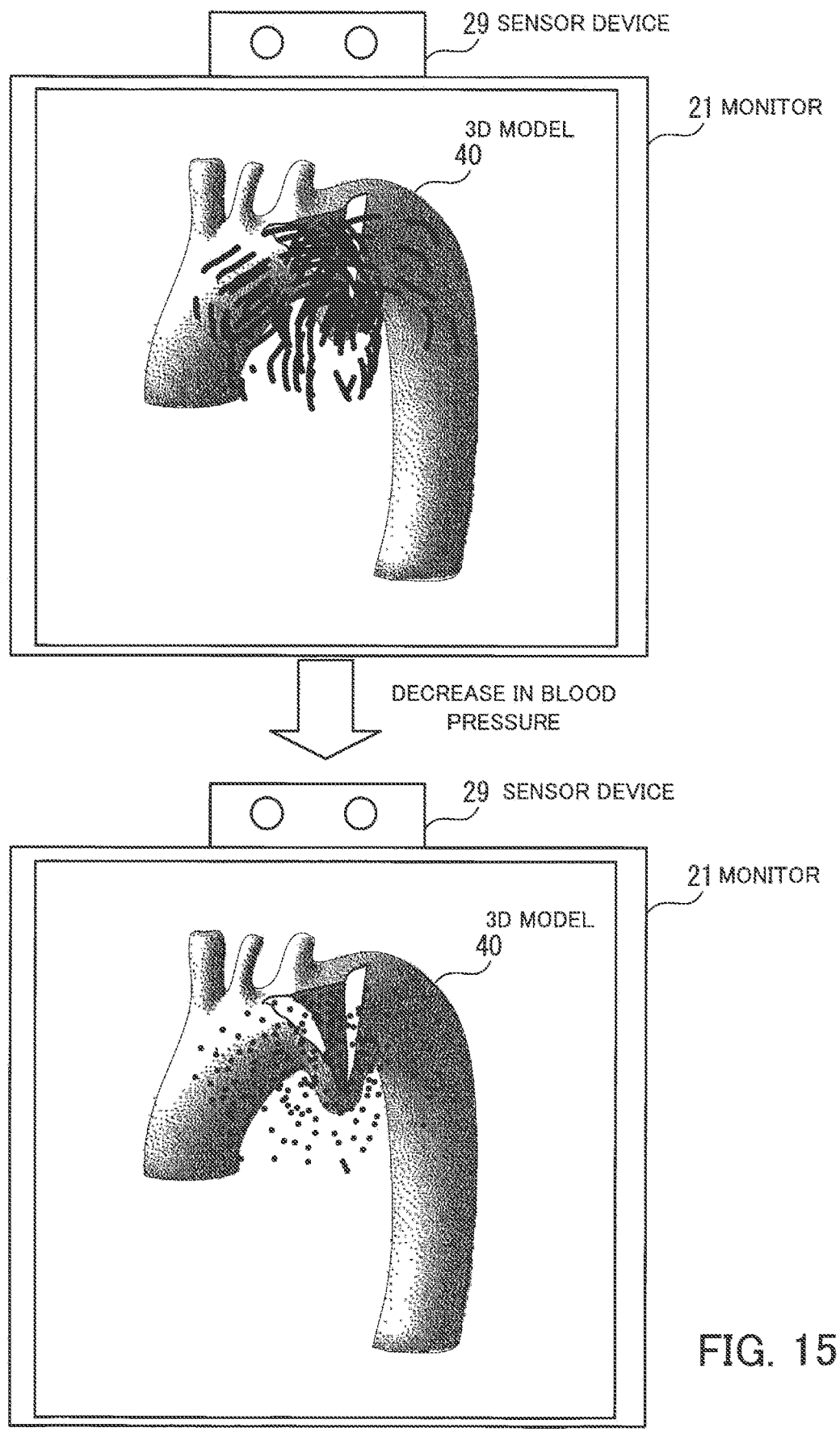
FIG. 15 illustrates a display example of fluid leakage.

FIG. 15 illustrates a display example of fluid leakage. As depicted in FIG. 15, for example, immediately after an incision is made, images of blood gushing out due to internal blood pressure are displayed. When the blood pressure drops, the images change to ones with bleeding out of the incision at a decreased rate.

In this manner, a physical quantity obtained based on the simulation result data 112 is visually displayed in a straightforward manner on the 3D model 40 linked to the solid model 30.

Other Embodiments

According to the second embodiment, markers are not used for the solid model 30; however, they may be provided at key points on the solid model 30. Markers placed on the solid model 30 allow the 3D model control unit 130 to determine the shape and orientation of the solid model 30 based on the position of the markers. In addition, providing a marker on a fingertip of a doctor allows easy identification of a load-applied point when the doctor applies a load onto the solid model 30 with the fingertip.

Note that if time series data is available as the simulation result data 112, as illustrated in FIG. 6, the 3D model 40 may be manipulated based on the simulation result data 112, separately from operations on the solid model 30. For example, if results of a heart motion simulation are available, how the heart beats may be displayed on the monitor 21, using a 3D model of the heart. Then, when a doctor conducts an operation on a solid heart model, the computer 100 transforms the 3D model of the heart beating in accordance with the solid model. This gives the doctor an accurate preoperative understanding of the surgery.

According to an aspect, it is possible to transform a 3D model in virtual space in accordance with transformation of a solid model.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A visualization apparatus comprising:
   a memory configured to store three-dimensional model data representing a shape of a human body part in three dimensions and physical quantity data representing results of a simulation of blood pressure in the human body part, in which the three-dimensional model data is used; and
   a processor configured to execute a process including:
      detecting a change in a shape of a solid model of the human body part based on an image obtained by capturing the solid model;
      generating a three-dimensional model reproducing the shape of the human body part in virtual space based on the three-dimensional model data;
      transforming a shape of the three-dimensional model into a transformed three-dimensional model in accordance with the change in the shape of the solid model;
      calculating, upon an incision being made in the solid model, acceleration of particles representing blood spurt from the incision based on the physical quantity data;
      determining a normal direction of each of polygons in the incision as an acceleration direction of the particles;
      calculating trajectories of the particles in such a manner that the particles are accelerated with the acceleration of the particles over a distance corresponding to a radius of a blood vessel and then fall free under gravity after being discharged outside of the solid model; and
      outputting an image of the transformed three-dimensional model and the particles spurt from the polygons in the incision along the trajectories of the particles, each particle being emitted in a normal direction of a polygon from which the each particle spurt.

2. The visualization apparatus according to claim 1, wherein:
   the process further includes calculating values of a physical quantity in response to the change in the shape of the solid model, and changing a display mode of a transformed part of the transformed three-dimensional model according to the values of the physical quantity.

3. The visualization apparatus according to claim 2, wherein:
   the changing includes transforming, upon a load being applied to a part of the solid model, the three-dimensional model according to the change in the shape of the solid model caused by the load and calculating stress exerted on a part transformed due to the load; and the outputting includes outputting the image of the transformed three-dimensional model with the stress visualized thereon.

4. A visualization method comprising:

detecting a change in a shape of a solid model of a human body part based on an image obtained by capturing the solid model;

generating, by a processor, a three-dimensional model reproducing a shape of the human body part in virtual space based on three-dimensional model data representing the shape of the human body part in three dimensions;

transforming, by the processor, a shape of the three-dimensional model into a transformed three-dimensional model in accordance with the change in the shape of the solid model;

calculating, by the processor, upon an incision being made in the solid model, acceleration of particles representing blood spurt from the incision based on physical quantity data representing results of a simulation of blood pressure in the human body part, in which the three-dimensional model data is used;

determining, by the processor, a normal direction of each of polygons in the incision as an acceleration direction of the particles;

calculating, by the processor, trajectories of the particles in such a manner that the particles are accelerated with the acceleration of the particles over a distance corresponding to a radius of a blood vessel and then fall free under gravity after being discharged outside of the solid model; and outputting, by the processor, an image of the transformed three-dimensional model and the particles spurt from the polygons in the incision along the trajectories of the particles, each particle being emitted in a normal direction of a polygon from which the each particle spurt.

5. A non-transitory computer-readable recording medium storing therein a computer program that causes a computer to execute a process comprising:

detecting a change in a shape of a solid model of a human body part based on an image obtained by capturing the solid model;

generating a three-dimensional model reproducing a shape of the human body part in virtual space based on three-dimensional model data representing the shape of the human body part in three dimensions;

transforming a shape of the three-dimensional model into a transformed three-dimensional model in accordance with the change in the shape of the solid model;

calculating, upon an incision being made in the solid model, acceleration of particles representing blood spurt from the incision based on physical quantity data representing results of a simulation of blood pressure in the human body part, in which the three- dimensional model data is used;

determining a normal direction of each of polygons in the incision as an acceleration direction of the particles;

calculating trajectories of the particles in such a manner that the particles are accelerated with the acceleration of the particles over a distance corresponding to a radius of a blood vessel and then fall free under gravity after being discharged outside of the solid model; and outputting an image of the transformed three-dimensional model and the particles spurt from the polygons in the incision along the trajectories of the particles, each particle being emitted in a normal direction of a polygon from which the each particle spurt.

* * * * *